(12) United States Patent
He et al.

(10) Patent No.: US 7,027,289 B2
(45) Date of Patent: Apr. 11, 2006

(54) EXTENDED THIN FILM CAPACITOR (TFC)

(75) Inventors: Jiangqi He, Gilbert, AZ (US); Ping Sun, Gilbert, AZ (US); Hyunjun Kim, Chandler, AZ (US); Xiang Yin Zeng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 10/808,489

(22) Filed: Mar. 25, 2004

(65) Prior Publication Data

US 2005/0213281 A1    Sep. 29, 2005

(51) Int. Cl.
*H01G 4/228* (2006.01)
(52) U.S. Cl. ............... 361/306.2; 361/301.4; 361/303; 361/321.2; 361/311; 361/313; 438/250; 438/253; 438/587; 438/588; 257/532; 257/534
(58) Field of Classification Search ............ 361/306.2, 361/306.1, 301.4, 303, 321.2, 321.5, 311, 361/313; 438/250, 253, 587, 588; 257/532, 257/534
See application file for complete search history.

(56) References Cited

U.S. PATENT DOCUMENTS

| | | | | |
|---|---|---|---|---|
| 6,023,407 | A * | 2/2000 | Farooq et al. | 361/303 |
| 6,108,212 | A * | 8/2000 | Lach et al. | 361/768 |
| 6,667,207 | B1 * | 12/2003 | Ballantine et al. | 438/234 |
| 6,781,185 | B1 * | 8/2004 | Chen et al. | 257/310 |
| 6,818,469 | B1 * | 11/2004 | Mori et al. | 438/52 |
| 6,888,716 | B1 * | 5/2005 | List et al. | 361/306.2 |

* cited by examiner

*Primary Examiner*—Anthony Dinkins
*Assistant Examiner*—Nguyen T. Ha
(74) *Attorney, Agent, or Firm*—Venable LLP; Catherine M. Voorhees

(57) ABSTRACT

Extending high k material of a second dielectric layer to surround at least one thru-via designed to provide a signal other than a power signal to a die may eliminate discrete AC coupling capacitors to reduce cost and improve performance of the package.

30 Claims, 3 Drawing Sheets

EXTENDED THIN FILM CAPACITOR (TFC) ==

BACKGROUND OF THE INVENTION

High speed differential signals in a system level device require AC coupling to filter out a common mode signal. The necessary filtering has been achieved by mounting two small terminal capacitors on a motherboard of the device. However, these discrete components cause reliability issues as a result of the soldering of the components to mount the same to the motherboard. As a result of the issues encountered with mounting discrete capacitors, the total cost of using discrete components is increased due to increased processing time and additional components being used. In addition, the use of discrete components introduces difficulties for form factor shrinking. Consequently, the size of the motherboard tends to be on the larger size to support the number and size of discrete capacitors.

BRIEF DESCRIPTION OF THE DRAWINGS

The invention may be understood by referring to the following description and accompanying drawings that are used to illustrate embodiments of the invention. In the drawings:

FIG. 3 shows a portion of the device without an extension and FIG. 4 shows a portion of the device with an extension according to an embodiment of the invention;

DETAILED DESCRIPTION OF THE INVENTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "exemplary embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

In the instant description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

The term "package" refers to a circuit, a structure and/or a technique that employs the inventive device as described below. A "package" or system that incorporates the inventive device has reduced manufacturing costs and improved performance.

Figure 1A:
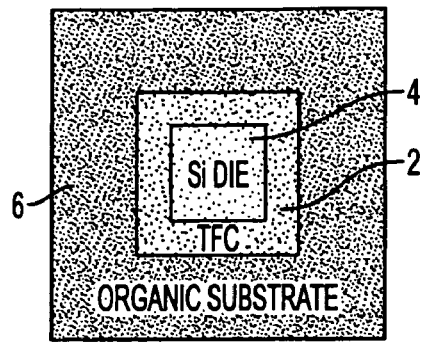
FIGS. 1a and 1b respectively show a top view and a side view of an embodiment of the present invention.
Figure 1B:
Figure 2:
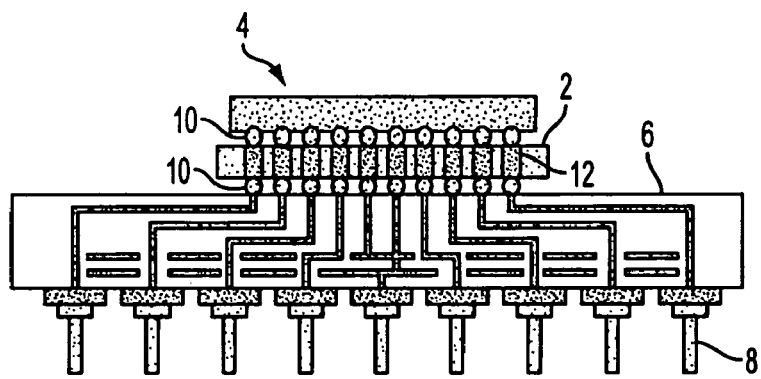
FIG. 2 is an enlarged side view of an embodiment of FIG. 1b that illustrates the architecture of an embodiment of the invention.

As shown in FIGS. 1a, 1b, and 2, the present invention may provide an interposer substrate 2 for mounting circuit die 4 that may be used for both power delivery and delivery of signals other than power to die 4. In one of the various embodiments, the interposer substrate 2 may be mounted between a die 4 and a base substrate 6 and may provide capacitance on power supply lines and alternating current (AC) coupling on lines delivering signals other than power to die 4. That is, the present invention, in one of the embodiments, may provide an AC coupling device that may be embedded in an interposer substrate (e.g., a thin film capacitor (TFC)) disposed between a die 4 and a base substrate 6. The present invention, in another of the embodiments, may modify an existing thin film capacitor, which may originally be used to provide power delivery to die 4 so that it may be used as an interposer substrate 2 between a die 4 and a base substrate 6 and also provide AC coupling to non-power signals.

In accordance with embodiments of the present invention, interposer substrate 2 may be soldered between die 4 (e.g., CPU die) and base substrate 6 so that power/ground delivery paths of the interposer substrate 4 may correspond to power/ground delivery bumps of circuit die 4 and all signal paths of the base substrate 6 may correspond to one of power/ground delivery paths or non-power delivery paths of interposer substrate 4. The power and non-power signals may be delivered to base substrate 6 through connectors 8. As shown in FIG. 2, electrical paths in substrate 6 may permit the signals delivered to connectors 8 to reach the conductive bumps 10 of the interposer substrate 2. In a similar manner, thru-vias 12 may deliver the signals to conductive bumps 10 of circuit die 4. The conductive bumps 10 may be created with solder balls at the tops of the electrical paths or thru-vias 12.

In accordance with these embodiments, the conductive paths or thru-vias may serve as the power supply paths for the CPU die 4. The conductive paths may be substantially isolated from input/output signal paths or the non-power signals. Base substrate 6 may be an integrated circuit board and may be comprised of an organic substrate material, such as ABS or FR4 type of materials; however, this is not a requirement. Any material that provides the necessary mechanical strength and connectivity desired may be used as the base substrate.

Figure 3:
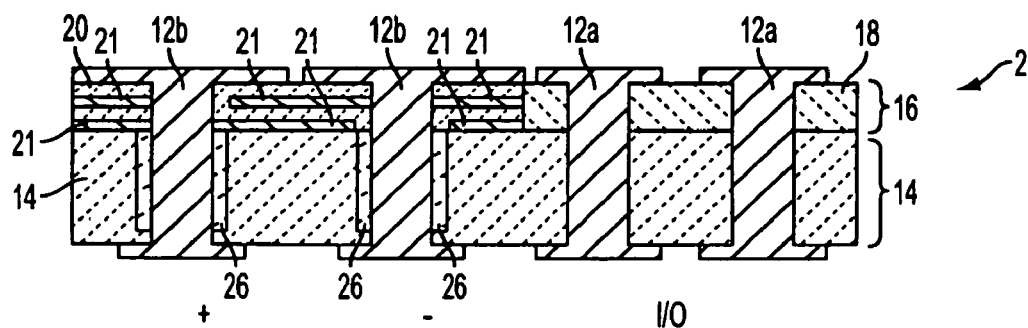
FIGS. 3 and 4 illustrate magnified, cross-section views of portions of embodiments according to the present invention where

FIG. 3 illustrates a cross sectional view of interposer substrate 2, according to an embodiment of the invention, showing four thru-vias 12 and the surrounding dielectric material. The dielectric material permits the passage of current (signals), but is not metal. The two right thru-vias 12a may be non-power signal paths, while the two left thru-vias 12b may be power/ground delivery signal paths. Interposer substrate 2 may comprise first dielectric interposer layer 14, which may be a ceramic interposer, and a second layer of dielectric material 16 adjacent base substrate layer 14. Any dielectric material with good CTE (Coefficient of Thermal Expansion) may be used in the first dielectric layer 14. In one embodiment of the present invention, first dielectric layer 14 may be a ceramic material, which may be designed to relieve stress between die 4 and base substrate 6. Thru-vias 12a and 12b may extend through both first dielectric interposer layer 14 and second dielectric layer 16.

Figure 4:
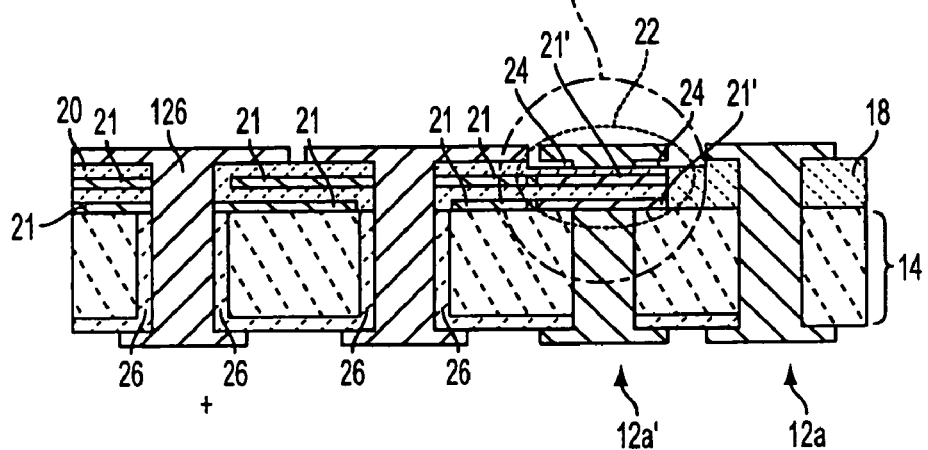

Second dielectric layer 16 may include a low k or no k material 18 that may surround thru-vias 12a that may be adapted to provide signals other than power signals to die 4. These signals other than power signals may not require AC coupling as they are not power/ground signals. A high k material 20 may surround thru-vias 12b that may be adapted to deliver signals that require AC coupling. A high k material may have good insulating properties and may create high capacitance. This structure is illustrated in FIGS. 3 and 4 where the left two thru-vias 12b may be adapted to provide power/ground signals and the right two thru-vias 12a may be adapted to provide digital signal (signals other than power). High k material 20 may be a one-piece bulk material with approximately horizontal metal layers 21 split from thru-vias 12b (FIG. 3). That is, the left-side high k material may form an embedded thin film capacitor (TFC), while the right side low k material may be a non-active extension of the thin film capacitor.

A function of the first interposer dielectric layer 14 may be to provide sufficient mechanical strength. Thus, the first interposer dielectric layer 14 may be made of a material having a low k value. As noted above, the "k" value refers to the ability of a material to hold an electrical charge. A material with a high k value may hold an electrical charge better than a low or no k material. The second dielectric layer 16, which includes a high k material, may be built upon the first interposer dielectric layer 14, which may be made of a material having sufficient mechanical strength and good CTE with respect to the base substrate 6 and die 4. As shown in FIG. 3, metal layers (plates) 21 may split from thru-via 12b and a high k material 20 may extend from a bottom metal plate to a top metal plate. Because metal layers 21 are very close to one another they may generate very high capacitance in these area. The very high capacitance may assist in the power delivery network so that clean power is delivered to die 4.

In this embodiment of the invention, high k material may preferably have a permittivity greater than or equal to about 100, while low k material may have a permittivity less than about 10. High k material 18 may generate high capacitance, which is good for power delivery and good for signals requiring AC coupling. However, high k material may not be good for signals that do not need AC coupling, such as the signals that pass through thru-vias 12a. The two right thru-vias 12a, in FIG. 3, may deliver signals other than power to die 4, and as a result, may not need capacitance or an AC coupling. Thus, low k material 18 of the second dielectric layer 16 may surround thru-vias 12a. In order to achieve an AC coupling for high speed differential signals, such as signals associated with a Peripheral Component Interconnect (PCI) application, a split TFC 22 for AC coupling may be created as shown in FIG. 4. Thru-via 12a may be designed to deliver a general signal or a signal other than power to die 4, and as such, may not require layer 16 may surround thru-vias 12a. In order to achieve an AC coupling for high speed differential signals, such as signals associated with a Peripheral Component Interconnect (PCI) application, a split TFC 22 for AC coupling may be created as shown in FIG. 4. Thru-via 12a may be designed to deliver a general signal or a signal other than power to die 4, and as such, may not require AC coupling. The signal path for PCI type applications achieved by thru-via 12a' may be surrounded by high k material 20 as the high k material of the second dielectric layer 16 is extended from the power/ground delivery thru-vias 12b to a thru-via for signal paths other than power/ground delivery (e.g., a PCI differential signal that needs AC coupling). In addition, a metal plate 21 may be disposed at the top of thru-via 12b. Similar to the capacitor structure on the left-hand side of FIG. 3, split TFC 22 includes metal plates 21' that may extend through thru-via 12a' and high k material may extend from the bottom metal plate 21' to an area above top metal plate 21'.

Figure 4A:
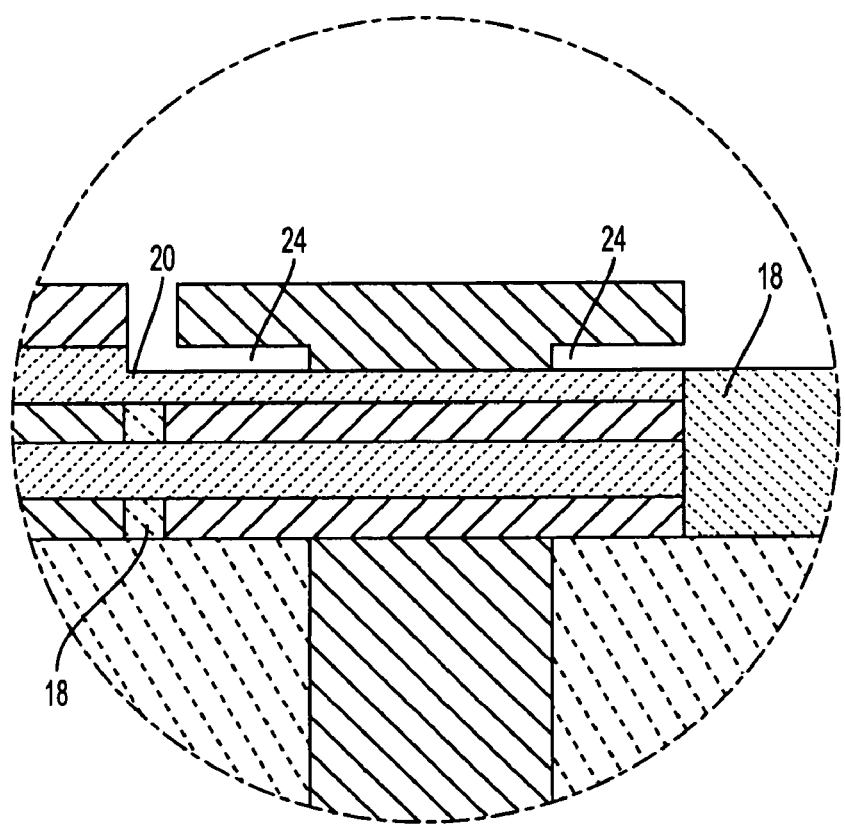
FIG. 4a enlarges the dash-dot circle area shown in FIG. 4.

In order to separate the power delivery network of the high k material 20 from the AC coupling network in split TFC 22, a space 24 may be formed in the extended high k material 20 of the second dielectric layer at an end of thru-via 12a' adjacent a signal bump where the split TFC 22 is formed. Space 24 extends between the top of thru-via 12a' and high k material 20 about thru-via 12a' and may aid in separating the power delivery network (the left-side thru-vias 12b) and the AC coupling network (split TFC 22), which otherwise may be linked to one another. As clearly shown in the enlarged portion surrounding TFC 22 in FIG. 4a, space 24 forms a gap in high k material 20 and since currents (signals) travel by conductivity, the conductivity is approximately zero at space 24 or the gap. As a result, current (signals) may not conduct or pass through the gap so current (signals) in the power delivery network (left-hand side, thru-vias 12b) may not travel to the non-power signal network of split TFC 22.

In an exemplary embodiment, a section 26 of the first dielectric interposer layer 14 through which a thru-via 12b extends may have a higher k value than that of the first dielectric interposer layer 14. That is, in this embodiment, the higher k material of the first interposer layer 14 may surround thru-vias 12b so that signals delivered therethrough do not stray into the interposer substrate material. This high k material of section 26 is a dielectric material, which may not have a value as high as high k material 20 and may be have a higher k value than that of the first interposer layer 14. In this embodiment, high k or low k material may not be a metal This may be achieved by forming a gap in the first dielectric interposer layer 14 and in the corresponding second dielectric layer 16 and then filling the gap with a higher k material, which becomes section 26. As stated above, high k may generate high capacitance, so it is good for power delivery, and good for signals require AC coupling.

Die 4 may be a silicon-based die. In an embodiment of the present invention, interposer substrate 2 may provide better CTE matching between die 4 and base substrate 6. Although the interposer substrate 2 of the present invention is described herein as coupling between a single die and a substrate, the interposer substrate of the present invention may be equally applicable to multichip modules and may be used to couple several dies to a substrate.

Figure 5:
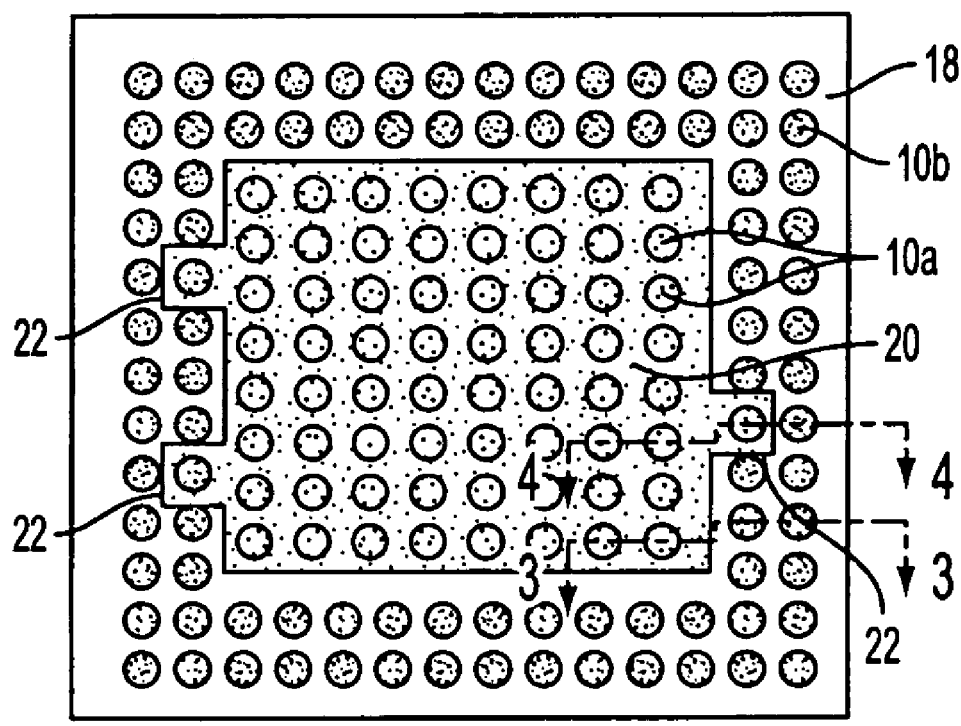
FIG. 5 shows a top view of an embodiment of the invention showing where cross-sections of FIGS. 3 and 4 are taken and indicating a high k material and a low k material, where the "k" value refers to the ability of the material to hold an electrical charge.

As shown in FIG. 5, one embodiment of the interposer substrate 2 according to the invention may be generally rectangular in shape and may have an array of thru-vias designed to deliver power signals to a die surrounded by rows (or columns) of thru-vias designed to provide signals other than a power signal to die 4. The high k material 20 may surround power/ground signal bumps 10a in a generally rectangular shape, whereas low k material 18 may surround signal bumps 10b designed to provide signals other than power signals (e.g., input/output signals to die 4). The high k material may be extended outside the array of power/ground signal bumps 10a into a column or row of non-power signal bumps 10b so that the extended high k material may provide an extra function to non-power signals. For example, if high speed differential signals may be sent through a non-power bump 10b to die 4, an AC coupling network similar to that shown in FIG. 4 at split TFC 22 may be formed to have the desired AC coupling purpose.

A method of fabricating a device, as described above, may employ an existing thin film capacitor (TFC) and interposer substrate that may be used for mechanical reasons and power delivery. The existing TFC may be modified by extending the high k material of the TFC horizontally underneath a die 4 so that non-power signal bumps 10a that may need an extra function, such as AC coupling, may be provided with the same. The extended high k material of an existing TFC or another second dielectric layer 16 may surround at least one thru-via 12a corresponding to the non-power bump 10. Depending upon the application need, more than one extended area 22 of high k material 20 of the second dielectric layer 16 may be formed to surround at least one thru-via designed to provide a signal other than a power signal to a die on any side of the array of power/ground signal bumps 10.

The foregoing description is intended to be illustrative and not limiting. Variations will occur to those of skill in the art. For example, the substrate may be made any material that has behavior characteristics similar to that of a silicon material. Those variations are intended to be included in the various embodiments of the invention, which are limited only by the spirit and scope of the appended claims.

We claim:

1. A device comprising:
   a first dielectric interposer layer through which a number of thru-vias extend; and
   a second dielectric layer adjacent said first dielectric interposer layer, where said second dielectric layer includes a high k material surrounding thru-vias to deliver power signals to a die and a low k material surrounding thru-vias to provide signals other than power signals to a die;
   wherein an area of the high k material of said second dielectric layer is extended to surround at least one thru-via to provide a signal other than a power signal to a die.

2. The device according to claim 1, wherein said extended area of high k material of said second dielectric layer comprises an embedded capacitor so that said at least one thru-via to provide a signal other than a power signal provides AC coupling for signals other than power signals.

3. The device according to claim 2, wherein said at least one thru-via to provide a signal other than a power signal to a die is surrounded by the extended area of high k material of the second dielectric layer forming an AC coupling network; wherein the extended area of high k material of the second dielectric layer is adjacent low k material that surrounds thru-vias to provide signals other than power signals to a die; and wherein said at least one thru-via to provide a signal other than a power signal to a die is surrounded by a space at an end of the at least one thru-via adjacent a signal bump in order to separate a power delivery network from the AC coupling network.

4. The device according to claim 3, wherein the AC coupling is for differential signals used for Peripheral Component Interconnect (PCI) applications.

5. The device according to claim 1, wherein the first dielectric interposer layer has a section through which a thru-via to deliver power signals to a die extends, where said section is made of a higher k material than that of the first dielectric interposer layer.

6. The device according to claim 1, wherein said first dielectric interposer material comprises ceramic material to relieve stress between a die and a substrate.

7. The device according to claim 1, wherein the device is generally rectangular in shape and has an array of thru-vias to deliver power signals to a die where said at least one thru-via to provide a signal other than a power signal to a die extends outside said array of thru-vias, and where the high k material of the second dielectric layer is adjacent to low k material that surrounds outside rows of thru-vias to provide signals other than power signals to a die; and
   wherein the extended area of high k material of said second dielectric layer is formed with a space about the at least one thru-via designed to provide a signal other than a power signal in order to separate a power delivery network from another signal network.

8. The device according to claim 7, further comprising a number of rows of thru-vias to provide signals other than power signals to a die, said number of rows of thru-vias surrounding said array of thru-vias to deliver power signals to a die.

9. The device according to claim 8, further comprising at least a second extended area of high k material of said second dielectric layer formed to surround at least one thru-via to provide a signal other than a power signal to a die where said extended area of high k material and said at least a second extended area of high k material are formed on any side of said array of thru-vias.

10. The device according to claim 1, wherein the high k material comprises a material having a permittivity greater than or equal to about 100.

11. The device according to claim 1, wherein the low k material comprises a material having a permittivity less than about 10.

12. The device according to claim 1, wherein said device comprises a thin film capacitor.

13. A package comprising:
    a die having power delivery and non-power signal bumps;
    an interposer substrate disposed adjacent the die and having thru-vias corresponding to the power delivery and non-power signal bumps of said die; and
    a base substrate disposed on the other side of said interposer substrate from said signal bumps, disposed for delivering signals to the power delivery and non-power thru-vias of the interposer substrate and corresponding bumps of said die;
    wherein said interposer substrate is made from a dielectric material with the power delivery and non-power signal thru-vias extending therethrough and comprises:
      a first dielectric interposer layer through which the thru-vias extend; and
      a second dielectric layer adjacent said first dielectric interposer layer where said second dielectric layer includes a high k material surrounding thru-vias to deliver power signals to said die and a low k material surrounding thru-vias to provide signals other than power signals to said die;
    wherein said second dielectric layer is extended to surround at least one thru-via to provide a signal other than a power signal to said die.

14. The package according to claim 13, wherein said at least one thru-via to provide a signal other than a power signal provides AC coupling for signals other than power signals.

15. The package according to claim 14, wherein a high k material of the extended second dielectric layer surrounds said at least one thru-via to provide a signal other than a power signal to said die forming an AC coupling network; wherein the high k material of the extended second dielectric layer is adjacent low k material that surrounds thru-vias to provide signals other than power signals to said die; and wherein said extended second dielectric layer of high k material is formed with a space surrounding said an end of the at least one thru-via adjacent a signal bump in order to separate a power delivery network from the AC coupling network.

16. The package according to claim 15, wherein the AC coupling is for differential signals used for Peripheral Component Interconnect (PCI) applications.

17. The package according to claim 13, wherein the first dielectric interposer layer has a section through which a thru-via to deliver power signals to said die extends, said section being made of a higher k material than that of the first dielectric interposer layer.

18. The package according to claim 13, wherein said first dielectric interposer material comprises ceramic material to relieve stress between a die and a substrate.

19. The package according to claim 13, wherein the substrate comprises organic material.

20. The package according to claim 13, wherein the interposer substrate has an array of power delivery thru-vias, which is surrounded by rows of non-power signal thru-vias, and wherein the power delivery thru-vias and non-power signal thru-vias are coupled to the corresponding signal bumps of said die; and wherein at least one extended second dielectric layer surrounds at least one non-power signal thru-via.

21. The package according to claim 13, wherein the high k material comprises a material having a permittivity greater than or equal to about 100.

22. The package according to claim 13, wherein the low k material comprises a material having a permittivity less than about 10.

23. The package according to claim 13, wherein said interposer substrate comprises a thin film capacitor about thru-vias to deliver power signals to said die; a split thin film capacitor about the at least one thru-via to provide a signal other than a power signal to said die; and a low k material area surrounding the remaining thru-vias to provide a signal other than a power signal to said die.

24. A method of fabricating a device comprising:
providing a first dielectric interposer layer through which a number of thru-vias extend;
providing a second dielectric layer adjacent said first dielectric interposer layer, said second dielectric layer being formed of a high k material that surrounds thru-vias to deliver power signals to a die and being formed of a low k material that surrounds thru-vias to provide a signal other than a power signal to a die; and
extending the high k material of said second dielectric layer to surround at least one thru-via to provide a signal other than a power signal to a die.

25. The method according to claim 24, wherein said extended high k material of said second dielectric layer comprises an embedded capacitor and said extended high k material provides AC coupling for signals other than power signals of the at least one thru-via to provide a signal other than a power signal to a die.

26. The method according to claim 25, further comprising forming a gap in said extended high k material about an end of said at least one thru-via to provide a signal other than a power signal to a die so that the AC coupling network is separated from the power delivery network of the thru-vias to deliver power signals.

27. The method according to claim 24, further comprising forming a gap in said first dielectric interposer layer about thru-vias to deliver power signals to a die; and filling the formed gap with material of a higher k value than that of the first dielectric interposer layer.

28. The method according to claim 27, wherein the gap is formed by etching the material of the first dielectric interposer layer about the thru-vias to deliver power signals to a die.

29. The method according to claim 24, wherein the high k material comprises a material having a permittivity greater than or equal to about 100.

30. The method according to claim 24, wherein the low k material comprises a material having a permittivity less than about 10.

* * * * *